United States Patent
Tyagi et al.

(10) Patent No.: US 10,942,283 B2
(45) Date of Patent: Mar. 9, 2021

(54) TWO SINGLE CRYSTALS BASED PHOSWICH DETECTOR FOR DISCRIMINATING VARIOUS KINDS OF RADIATIONS

(71) Applicant: Secretary, Department of Atomic Energy, Maharashtra (IN)

(72) Inventors: Mohit Tyagi, Mumbai (IN); Sheetal Rawat, Mumbai (IN); Sanjay C Gadkari, Mumbai (IN)

(73) Assignee: SECRETARY, DEPARTMENT OF ATOMIC ENERGY, Maharashtra (IN)

( * ) Notice: Subject to any disclaimer, the term of this patent is extended or adjusted under 35 U.S.C. 154(b) by 13 days.

(21) Appl. No.: 16/358,427

(22) Filed: Mar. 19, 2019

(65) Prior Publication Data
US 2020/0301028 A1   Sep. 24, 2020

(51) Int. Cl.
| | | |
|---|---|---|
| G06T 1/20 | (2006.01) | |
| G01T 1/202 | (2006.01) | |
| G01T 3/06 | (2006.01) | |
| C30B 29/12 | (2006.01) | |
| G01T 1/15 | (2006.01) | |
| G01T 1/20 | (2006.01) | |

(52) U.S. Cl.
CPC .......... G01T 1/2008 (2013.01); C30B 29/12 (2013.01); G01T 1/15 (2013.01); G01T 1/202 (2013.01); G01T 3/06 (2013.01)

(58) Field of Classification Search
CPC .............................. G01T 1/2008; G01T 1/202
See application file for complete search history.

(56) References Cited

U.S. PATENT DOCUMENTS 6,313,465 B1 * 11/2001 Nittoh ...................... G01T 7/00
                                                           250/368
2009/0039271 A1 * 2/2009 Farsoni ................. G01T 1/2008
                                                           250/367

OTHER PUBLICATIONS

Rawat et al., "A new phoswich design of Csl:Tl/GGAG:Ce,B scintillators for pulse shape discrimination," 62 DAE-Bms Sumposium on Nuclear Physics,Dec. 20, 2017; retrieved from Internet [Jun. 6, 2020]; Retrieved from url <www.sympnp.org/proceedings>. (Year: 2017).*

Korzhik et al., "Ce-doped Gd3Al2Ga3O12 scintillator for compact, effective and high time resolution detector of the fast neutrons," Jul. 2018; retrieved from Internet [Jun. 6, 2020]; retrieved from url <https://arxiv.org/ftp/arxiv/papers/1807/1807.06390.pdf>. (Year: 2018).*

* cited by examiner

Primary Examiner — Yara B Green
(74) Attorney, Agent, or Firm — Masuvalley & Partners

(57) ABSTRACT

The present invention discloses single crystal based phoswich detector for discriminating various kinds of radiations. The invented phoswich detector comprises a single crystal based scintillator having at least a pair of single crystals with identical refractive indices and different scintillation kinetics and a photo-sensor coupled to the single crystal based scintillator to detect a scintillation light pulse generated through interaction of radiation elements with the pair of the single crystals for discrimination of different kinds of radiation elements based on a dissimilarity in the scintillation light pulse shapes generated through the interactions.

8 Claims, 6 Drawing Sheets

TWO SINGLE CRYSTALS BASED PHOSWICH DETECTOR FOR DISCRIMINATING VARIOUS KINDS OF RADIATIONS

FIELD OF THE INVENTION

The present invention relates to radiation detector. More specifically, the present invention is directed to develop a novel phoswich detector consisting of two single crystal scintillators to discriminate various types of radiation elements with high figure of merit and having versatile applications in academic, nuclear, security and medical fields.

BACKGROUND OF THE INVENTION

The scintillation detectors have various applications which are continuously increasing with the finding of new materials, photo-sensors and data acquisition systems. No single material has the required properties to be used in all applications. An appropriate material is selected for a particular application based on the type of incident radiation, intensity, requirement of size and the desired output, etc. For different kinds of radiations like α, β, γ, heavy charged particles, neutrons, etc., different scintillating materials are usually deployed based on the type of interaction and conversion into a measurable signal.

Neutral particles like neutrons require special materials consisting of atoms with significant values of the capture cross-section. Alpha and heavy charged particles require thin scintillators while gamma radiations need larger size with higher stopping efficiency. In a mixed field, different kinds of radiations are usually discriminated by two methods; pulse-height discrimination (PHD) or pulse-shape discrimination (PSD). The variations in light-yield for different kinds of radiations generate corresponding pulse-height in PHD method. On the other hand, some materials have more than one component of the scintillation decay whose ratios depend on the type of radiations. Therefore these materials have ability to discriminate different radiations based on the PSD method.

In some of the recent prior arts, a new class of detectors has been proven to be useful for discriminating different kinds of incident radiations. These detectors are sandwich/combination of two or more dissimilar materials with different pulse-shape characteristics and coupled to a common photo-sensor. These are called phoswich detectors including the combination of scintillating materials like organic, inorganic crystalline, thin films, etc. These detectors have found various applications in routine as well as in advanced detector systems for particle spectrometry, etc. The different response of the combination of scintillating materials also has an ability to provide depth of interaction (DOI) information which has added an additional dimension for the medical imaging. Therefore the advanced imaging systems are being developed based on the phoswich scintillators. The single crystals have various advantages over other scintillating materials and therefore the phoswich combination of single crystal scintillators leads to the best results in various applications.

The phoswich detectors reported in the prior inventions employ gas detectors, organic plastic scintillators, thin films, polycrystalline materials, and single crystals, etc. in combination with the similar phase material or single crystals. The detectors fabricated from different phases other than single crystals suffer with the problem of poor efficiencies especially at higher gamma energies. The combination of single crystals has advantage of better efficiency but the difference in refractive indices limits the choice of crystals that could be optically coupled together. Additionally the emission of the first crystal should effectively pass through the transmission region of the second crystal without significant absorption/excitation. Some of the previous arts have reported use of optical windows, filters, change in voltage, using different photo-sensors, etc. to be used effectively in a combination of two single crystals. Moreover the detection of thermal neutron requires the presence of atoms like Li, B and Gd, etc. that have a high thermal neutron capture cross-section that further limits the choice of using single crystals phoswich detectors to discriminate neutrons in addition to charged particles and gamma radiations.

Thus there has been a need for an improvement in the phoswich detector configuration which will enable the phoswich detector to discriminate neutrons in addition to charged particles and gamma radiations.

OBJECT OF THE INVENTION

It is thus the basic object of the present invention to develop an improved phoswich detector to discriminate various types of radiation elements with high figure of merit having versatile applications in academic, nuclear, security and medical fields.

Another object of the present invention is to develop an improved phoswich detector which would be adapted to discriminate radiation element like gamma radiations with different energies.

Yet another object of the present invention is to develop an improved phoswich detector which would be adapted to discriminate gamma radiations interacting at different positions of combined scintillators and provide a depth of interaction (DOI) information to improve the spatial resolution in possible imaging applications.

A still further object of the present invention is to develop an improved phoswich detector which would be adapted to score over the existing phoswich detectors to detect charged particles in presence of gamma radiations.

Another object of the present invention is to develop an improved phoswich detector which would be adapted to efficiently detect neutrons in presence of other radiations.

SUMMARY OF THE INVENTION

Thus according to the basic aspect of the present invention there is provided a phoswich detector to discriminate different kinds of radiations including single crystal based scintillator having at least a pair of single crystals cooperating to detect scintillation light pulse generated through interaction of radiation elements with different scintillation kinetics;

a photo-sensor coupled to said single crystal based scintillator to detect said generated scintillation light pulse including dissimilarity in the scintillation light pulse shapes generated through said interactions.

In a preferred embodiment of the phoswich detector, the pair of single crystals includes single crystals with almost identical refractive indices and different scintillation kinetics.

In a preferred embodiment of the phoswich detector, the photo-sensor detects the dissimilarity in the scintillation light pulse shapes for discrimination of different kinds of the radiation elements.

In a preferred embodiment of the phoswich detector, the pair of single crystals exhibits opposite trend of dependence of change in scintillation decay and different scintillation decay time components for different radiation elements comprising gamma and charged particles.

In a preferred embodiment of the phoswich detector, the pair of single crystals comprises Gd based garnet single crystal and alkali halide single crystal scintillator having identical refractive indices suitable for combination and coupling minimizing transmission loss of the scintillation light pulse from front crystal to back crystal of the single crystal based scintillator In a preferred embodiment of the phoswich detector, the single crystal based scintillator comprises the Gd based garnet crystal as the front crystal and the alkali halide single crystal as the back crystal to discriminate various kinds of the radiations in a mixed field of neutrons, gamma and the charged particles including alpha particle.

In a preferred embodiment of the phoswich detector, the Gd based garnet crystal includes single crystals of $Gd_3Ga_3Al_2O_{12}$ with $^{157}Gd$ and $^{155}Gd$ isotopes.

In a preferred embodiment of the phoswich detector, the alkali halide single crystal includes single crystals of CsI.

In a preferred embodiment of the phoswich detector, capture cross-section of the $^{157}Gd$ and $^{155}Gd$ isotopes and atomic density in the front Gd based garnet crystal stops up to 100% thermal neutrons in the front crystal which consequently emit conversion electrons, low energy X-rays and continuum of background gamma radiation whereby the background gamma radiation is detected in the back alkali halide single crystal.

crystals are configured to interact with incident gamma radiations which enables discrimination of the gamma radiations with different energies due to the dissimilar pulse-shapes generated through the interactions in one or both the crystals and measurement of depth of interaction.

In a preferred embodiment of the phoswich detector, interaction of the gamma in both the front and the back crystals enable precise detection of line of response and position of origin of the radiation thus improving spatial resolution of emitting source.

In a preferred embodiment of the phoswich detector, the photo sensor is connected with a desktop based digitizer for generating digital data equivalent to the photo sensor output and discriminating different radiation elements based on pulse-shape discrimination parameter (PSD).

In a preferred embodiment of the phoswich detector, the pulse-shape discrimination parameter corresponds to charges integrated in different time windows corresponding to different radiations and calculated by the digitizer based on difference of charges collected in long and short gates and divided by the charge collected in the long gate, whereby the long and the short gates are basically the time windows that defined based on the scintillation decay times of both single crystals.

In a preferred embodiment of the phoswich detector, the digitizer is interfaced to a display for showing discrimination result to the user.

In a preferred embodiment of the phoswich detector, both the front and the back crystals are doped with all possible combinations of dopants and their concentrations including but not limited to Ce, B in GGAG and TI in CsI for highest PSD parameter.

According to another aspect, there is provided a method for discriminating different kinds of radiations involving the above phoswich detector comprising: involving a single crystal based scintillator having at least a pair of single crystals cooperating to detect scintillation light pulse generated through interaction of the radiation elements with different scintillation kinetics;

detecting said generated scintillation light pulse in a photo-sensor coupled to said single crystal based scintillator involving dissimilarity in the scintillation light pulse shapes generated through said interactions.

BRIEF DESCRIPTION OF THE ACCOMPANYING DRAWINGS

Figure 3:
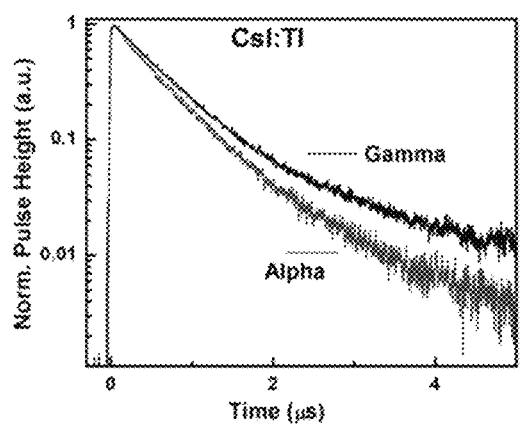
Figure 3:
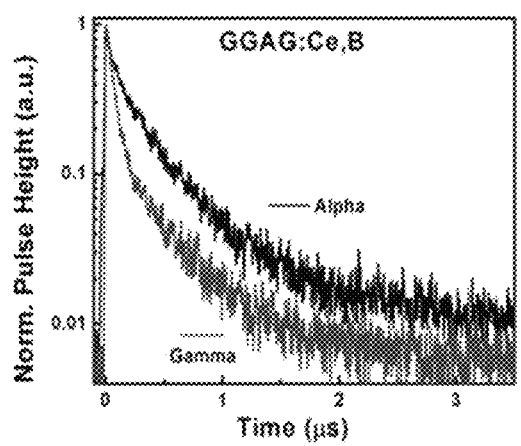
Figure 3:
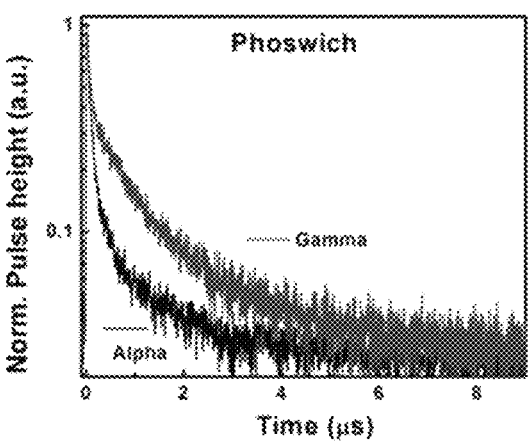

FIG. 3(a) through FIG. 3. (c) show the difference in scintillation decay times measured with alpha and gamma radiations falling on CsI:TI, GGAG:Ce,B and phoswich combination of both the crystals respectively.

Figure 4:
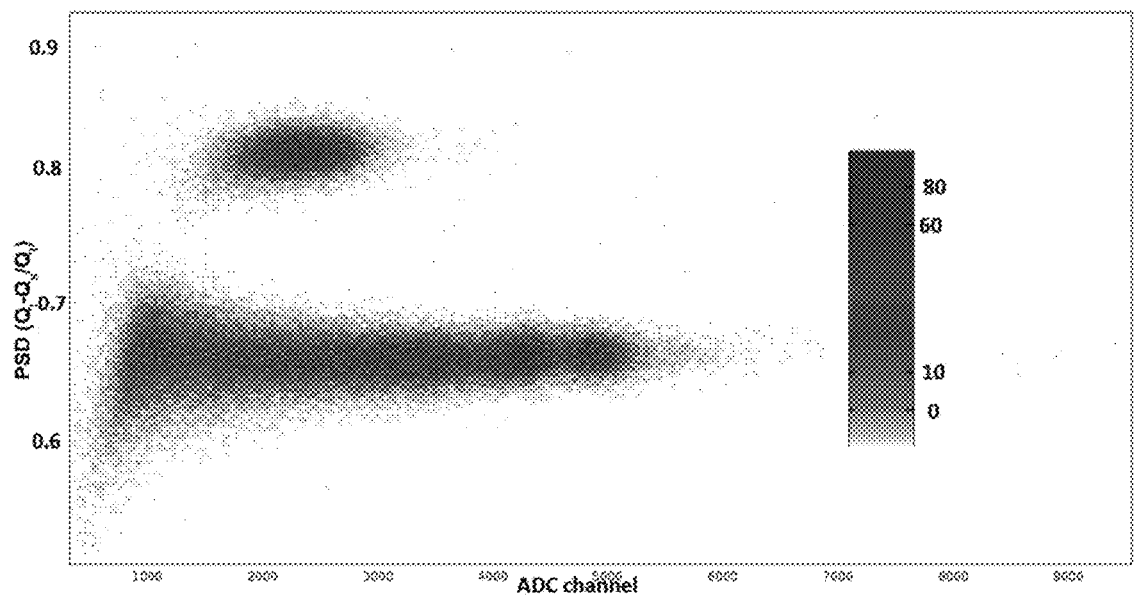
Figure 4:
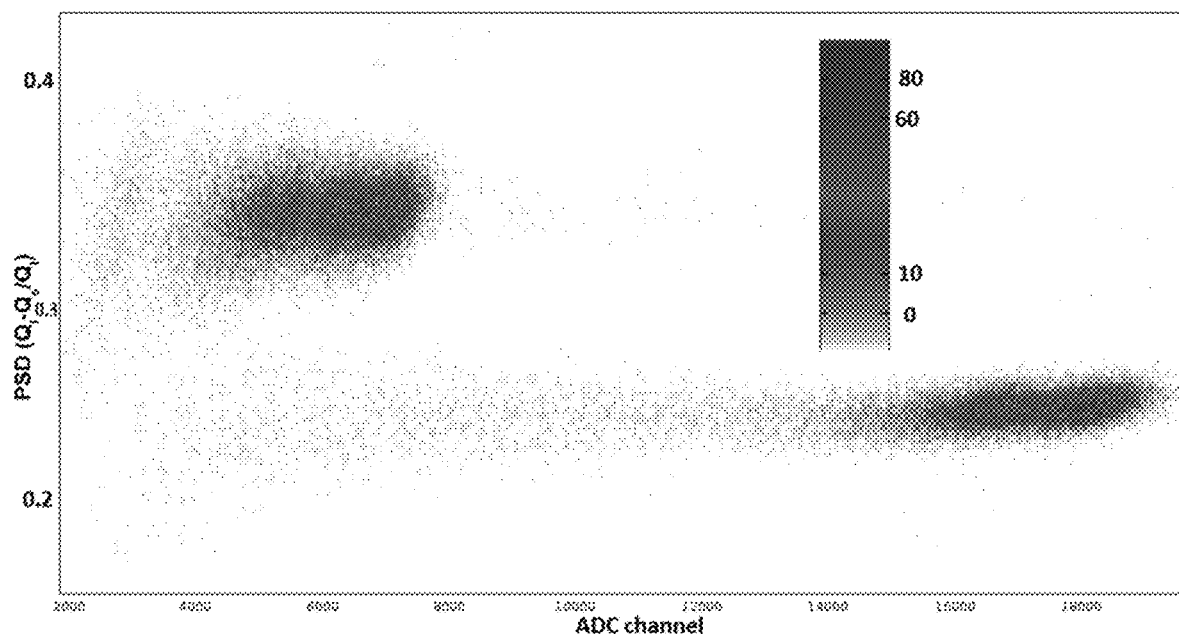
Figure 4:
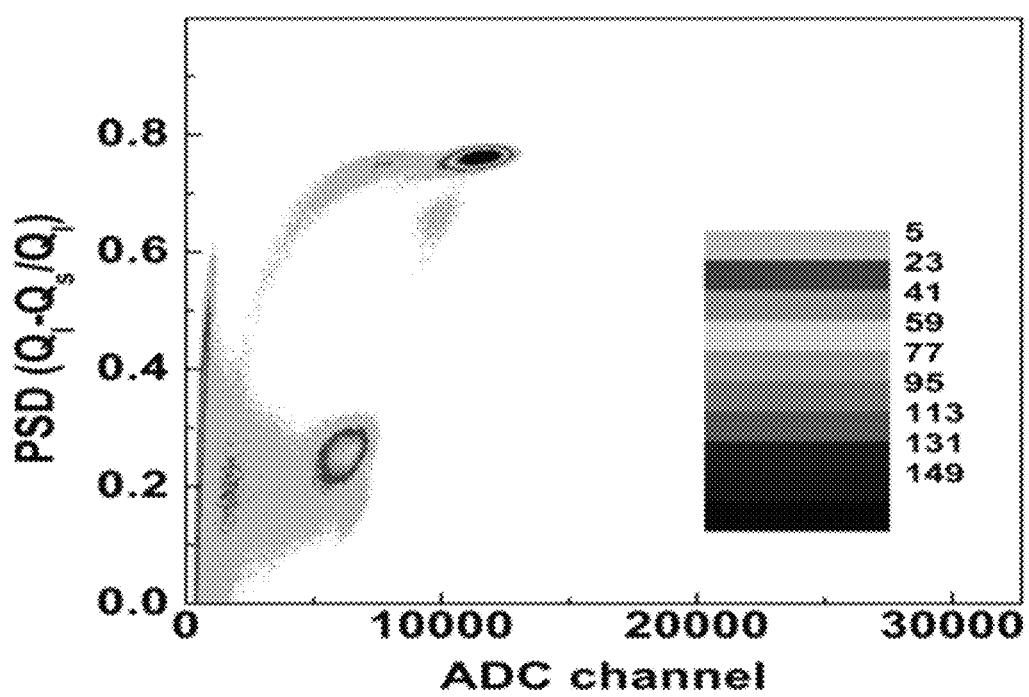

FIG. 4(a) through FIG. 4(c) show the alpha gamma discrimination ability of CsI, GGAG and phoswich combination respectively.

Figure 5:
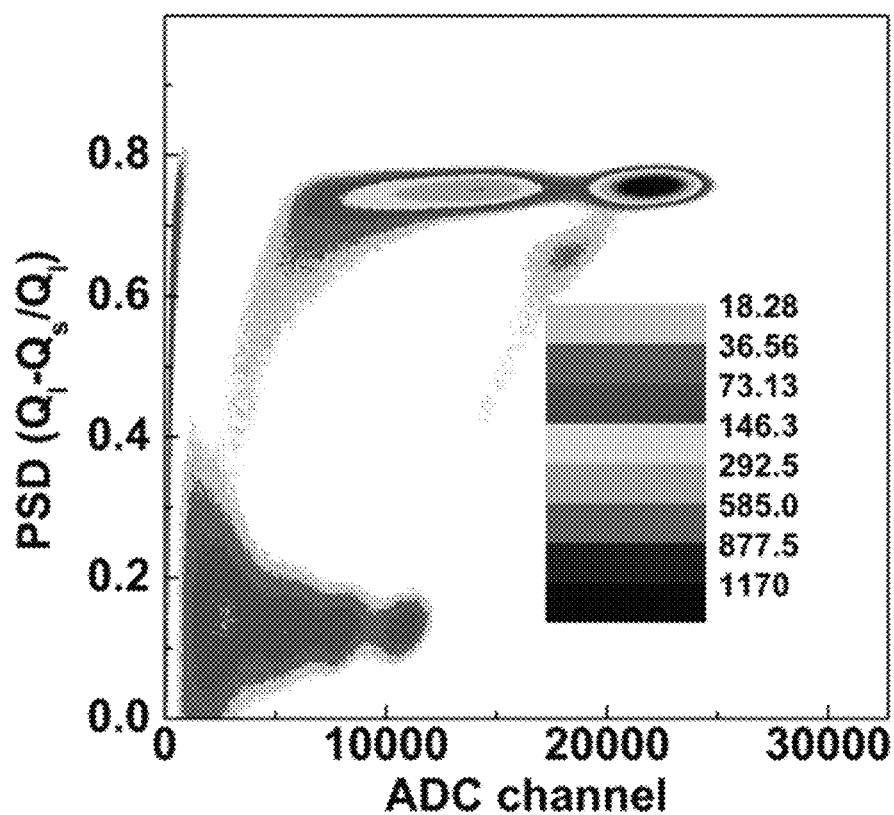

FIG. 5 shows the PSD parameter for gamma radiation falling on the phoswich detector in accordance with the present invention.

Figure 6:
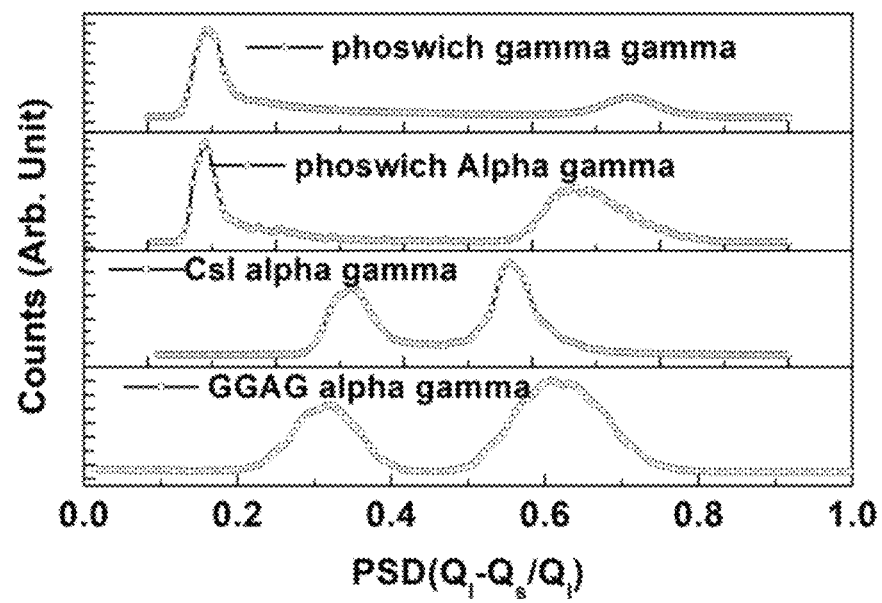

FIG. 6 represents the figure of merit for discriminating alpha and gamma in individual GGAG and CsI crystals and with a combination of crystals measured from PSD ratio method.

Figure 7:
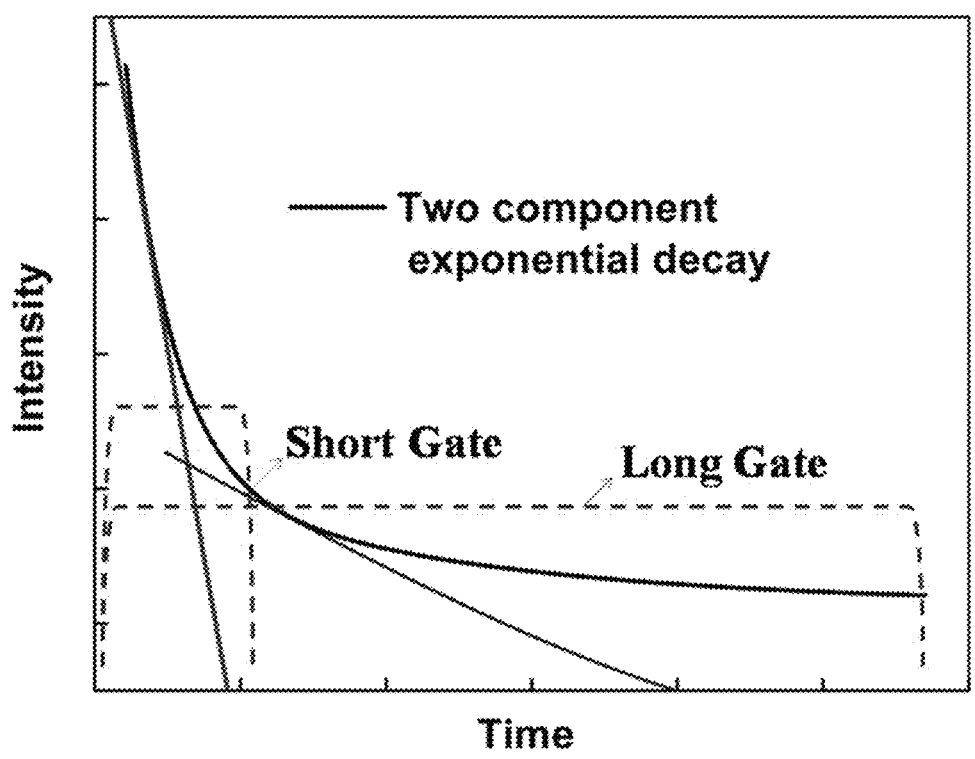

FIG. 7 shows a typical two exponential decay curve and the concept of PSD by integrating charges in two different time windows in accordance with the present invention.

DESCRIPTION OF THE INVENTION WITH REFERENCE TO THE ACCOMPANYING DRAWINGS

As stated hereinbefore, the present invention discloses a device which comprises a phoswich detector having combination of Gd based garnet crystal and alkali halide single crystal scintillator to discriminate various kinds of radiations in a mixed field. The "figure-of-merit" to discriminate the radiation elements is the best reported so far in single crystals or a combination of single crystals. The presence of Gd leads to the detection of thermal neutrons and the ability to discriminate the gamma interaction in both the crystals makes it possible its use in mixed field such as neutrons, gamma and charged particles.

Figure 1:
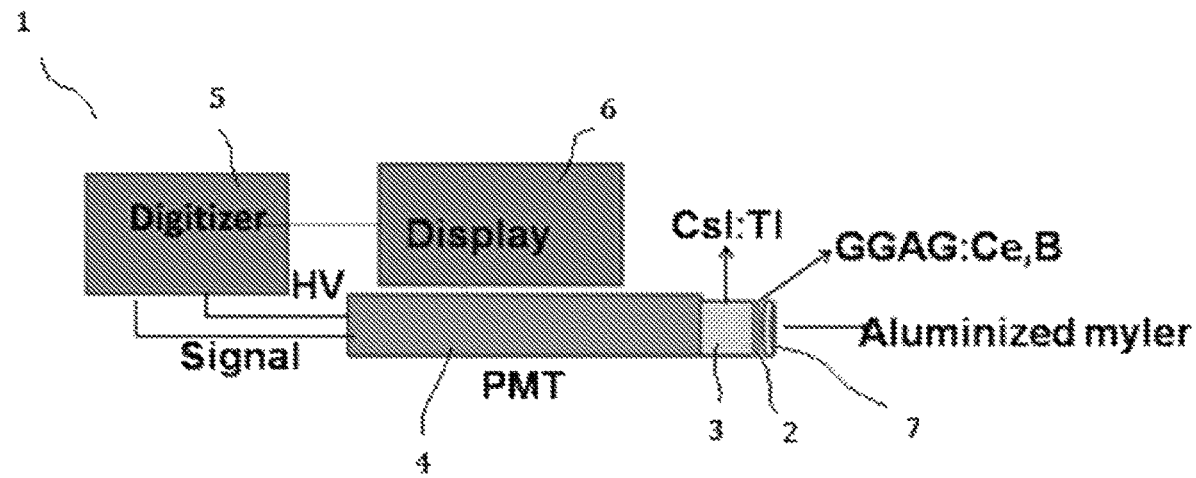
FIG. 1 shows schematic of improved phoswich detector embodiment in accordance with the present invention.
Figure 2:
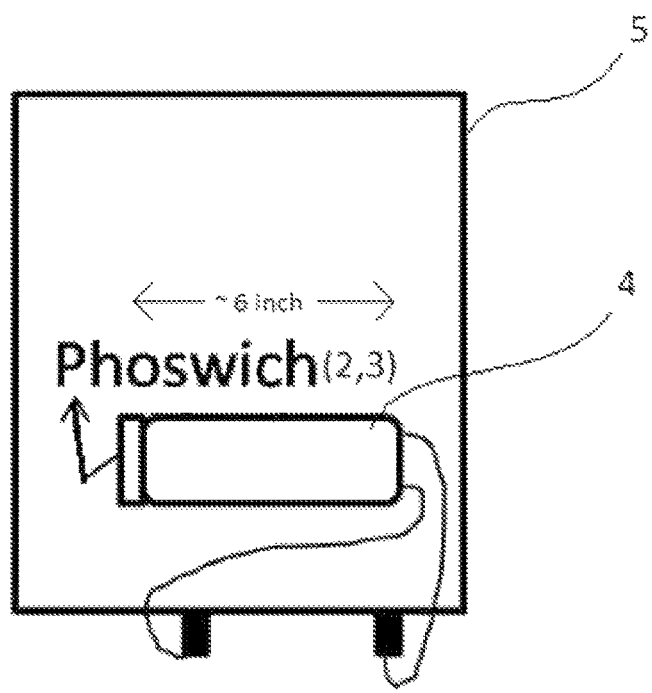
FIG. 2 shows complete setup of the phoswich detector embodiment in accordance with the present invention.

Reference is first invited from the accompanying FIG. 1 which represents the schematic of the present improved phoswich detector setup (1) where a single crystal based scintillator (2,3) is coupled with a photo multiplier tube (PMT) or a photo-sensor (4). The photo-sensor (4) is further connected to a digitizer (5). The HV for PMT is also provided by the digitizer. The phoswitch detector setup as shown in the FIG. 2 can be connected to a laptop or any other computer for recording and displaying the discrimination data.

As shown in the referred figures, in the present phoswich detector, the single crystal based scintillator includes a combination of at least two single crystal scintillators (2) and (3) to discriminate various kinds of radiation elements. The pair of the single crystal scintillators preferably comprises one or more single crystals of Gd based garnet crystal (2) and one or more of alkali halide single crystals (3) having identical refractive indices suitable for combination and coupling minimizing transmission loss of scintillation light pulse from front crystal to back crystal of the single crystal based scintillator. The paired single crystals (2) and (3) of the scintillator exhibits opposite trend of dependence of change in scintillation decay and different scintillation decay time components for different radiation elements comprising gamma and charged particles.

The photo-sensor (4) coupled to the pair of single crystals is configured to detect scintillation light pulse generated through interaction of the radiation elements with the pair of single crystals for discrimination of different kinds of the radiation elements based on dissimilarity in the scintillation light pulse shapes generated through the interactions.

As shown in the FIG. 1, the photo sensor output is connected with a digitizer (5) for generating digital data equivalent to the photo sensor output and thereby discriminating the different radiation elements based on pulse-shape discrimination ratio which basically corresponds to ratio of separation of peaks of two scintillation light pulses generated due to different radiation elements in both the crystals to sum of Full Width at Half Maxima for the pulses measured for both the peaks. The digitizer (5) can be interfaced to a display (6) for showing the discrimination result to the user.

In a preferred embodiment of the present phoswich detector, the Gd based garnet crystal includes single crystals of $Gd_3Ga_3Al_2O_{12}$ with $^{157}Gd$ and $^{155}Gd$ isotopes whereas the alkali halide single crystal includes single crystals of CsI. The single crystals of $Gd_3Ga_3Al_2O_{12}$ and CsI have shown their individual capabilities to discriminate alpha and gamma radiations. While the CsI is widely used in various applications, GGAG has been recently proven to be advantageous over various other commercial scintillators. However, the trend of change in the scintillation decay for gamma and charged particles is opposite in these two crystals. Since there is not a significant difference between refractive indices of these two crystals, a combination can be made with a common photo-sensor without much loss of the emitted light from the front crystal. The opposite trend and difference in decay times of these crystals further increase the discrimination. Further, the light generated due to interaction of particle/radiation in the first crystal (around 550 nm) passes efficiently through the second crystal. Therefore this novel phoswich combination has an enhanced "figure-of-merit" to discriminate different radiations by more than 100% in comparison to that when crystals are used individually.

Present phoswich detector also makes it possible to discriminate thermal neutrons due to involvement of the Gd based garnet crystal as the front crystal and the alkali halide single crystal as the back crystal exposed under various kinds of the radiations in a mixed field of neutrons, gamma and the charged particles including alpha particle. A very high capture cross-section of $^{157}Gd$ and $^{155}Gd$ isotopes present in the Gd based garnet crystal and the higher atomic density in the front single Gd based garnet crystal make it possible to stop almost 100% thermal neutrons in the front crystal which consequently emit conversion electrons, low energy X-rays and continuum of background gamma radiation. The background gamma detected in the larger back CsI can be discriminated effectively. On this it is important to note that, thermal neutrons and charged radiation particles can be 100% stopped in lesser than 1 mm disk of the front garnet crystal while high energy gamma passes through without much interaction and deposited its energy in the relatively larger back halide crystal, hence larger back CsI is preferred to construct the present detector. In a preferred embodiment, the Gd based front crystal can be covered by a Aluminized myler (7) to stop any light exposure to the detector without decreasing the energy of incident charged radiation particles. If it is any thicker reflector like Teflon at other surfaces, it would decrease or may even stop the heavy charged particles while myler is low density material and does not decrease the energy of charged particles significantly. The presence of Aluminum in the myler covering layer provides the reflection of the generated scintillation light towards the PMT/photo-sensor window and increase the light collection. This effectively reduces the PMT noise.

In the present phoswich detector, incident gamma radiations that interacted in the front and the back crystals enable discrimination of the gamma radiations with different energies due to the dissimilar pulse-shapes generated through the interactions in one or both the crystals. Also the gamma interaction with both the front and the back crystals make it possible to measure depth of interaction. The interaction of gamma in the front and the back crystals can be also discriminated which define the line of response and position of the origin of radiation more precisely in comparison to detected in one crystal which doesn't discriminate the interaction coming from front or from sides. Therefore this depth of interaction information improves the spatial resolution of emitting source of the gamma radiation, which is very useful for the imaging applications e.g. Positron emission tomography (PET) etc. This gamma discrimination is also useful for Compton background suppression in some applications. These measurements are performed in a portable setup and the performance may be further improved with more optimized electronics. Therefore this invention has numerous applications not only in academic researches but in various nuclear, medical, security industries as well.

In a preferred embodiment, both the front and the back crystals of the crystal based scintillator can be doped with all possible combinations of dopants and their concentrations including but not limited to Ce, B in GGAG and Tl in CsI for highest PSD parameter. The accompanying FIG. 3(a) through FIG. 3(c) show the difference in scintillation decay times measured with alpha and gamma radiations falling on CsI:Tl, GGAG:Ce,B and phoswich combination of both the crystals respectively.

The accompanying FIG. 4(a) through FIG. 4(c) represent the alpha gamma discrimination ability of CsI, GGAG and phoswich combination respectively. The Y-axis shows the pulse-shape discrimination (PSD) parameter. The PSD parameter is calculated by the digitizer based on the difference of charges collected in long and short gates and divided by the charge collected in the long gate. The X-axis represents the ADC channel number of the digitizer which can be calibrated for the energies. The phoswich detector improves the discrimination by more than 100% in comparison with that recorded using conventional CsI:Tl single crystals.

The long and short gates are basically the time windows that defined based on the scintillation decay times of both single crystals. The digitizer integrates these decay pulses to measure the charges collected in the respective defined time windows. Reference in this context invited from the accompanying FIG. 7 which shows a typical two exponential decay curve and the concept of PSD by integrating charges in two different time windows.

The accompanying FIG. 5 shows the PSD parameter for gamma radiation falling on the phoswich detector. The figure of merit for the discrimination indicates numerous applications as DOI detectors for imaging. The presence of Gd in the front crystal also generates low energy x-rays and gamma due to the interaction with thermal neutrons which can be effectively discriminated with the background gamma interacting with the CsI crystal. This makes this novel combination to have various applications involving the detection of thermal neutrons in mixed fields.

The FIG. 6 represents the figure of merit for discriminating alpha and gamma in individual GGAG and CsI crystals and with a combination of crystals measured from PSD ratio method. The FOM for gamma-gamma discrimination using the phoswich detector is also shown. The improvement in the FOM indicates a new way to use this combination in numerous applications.

Working Principle:

Single crystals of CsI and GGAG have more than one exponential component in their scintillation decay. The ratio of these components gets significantly affected with the mode of excitation. The gamma and charged particles generate different ionization densities and therefore affect the intensity and kinetics of the relaxation of excitations. In CsI, the decay time for alpha excitations was measured to be faster than that observed for gamma radiations. On the other hand, the alpha radiation slows down the scintillation decay in comparison to gamma radiations in GGAG crystal. This dependence is utilized by various techniques to discriminate different kinds of radiations. One method is to integrate the charges collected in short and long gates selected based on the decay times. The PSD parameter represents the ratio of this difference with the charges collected in the long gate. In case of CsI, this value is lesser for alpha radiations in comparison with gamma while in contrary, GGAG shows an opposite trend where alpha radiation gives higher PSD values. Additionally, the average decay time for GGAG is of the order of ~100 ns and about one order shorter than that observed in case of CsI crystals. Therefore the opposite trend of dependence and difference in the decay time components, the combination of these two crystals could significantly improve the discrimination and provide a superior "figure-of-merit" for the discrimination compared to that reported so far for a combination of single crystals. The emission of GGAG around 550 nm falls in the transmission range of the CsI crystals and therefore makes it possible to efficiently collect the generated light by using a single photo-sensor.

We claim:

1. A phoswich detector to discriminate different kinds of radiations including;
    a single crystal based scintillator having a pair of single crystals comprised of single crystals with identical refractive indices and different scintillation kinetics cooperating to generate a scintillation light pulse through interaction of radiation elements with the different scintillation kinetics including opposite trends of dependence and difference in a decay time components of a combination of the two single crystals;
    the pair of single crystals thereby selectively enabling for combination and coupling minimizing a transmission loss of the scintillation light pulse from a front crystal to a back crystal of the pair of single crystals based scintillator;
    a photo-sensor coupled to said single crystal based scintillator to detect said generated scintillation light pulse including dissimilarity and the opposite trends of dependence and difference in the decay time components of the combination in the scintillation light pulse shapes generated through said interactions;
    thereby significantly improving the discrimination and providing a superior "figure-of-merit" for the discrimination of said different kind of radiations;
    wherein the pair of single crystals comprises Gd based garnet single crystal and alkali halide single crystal scintillator having identical refractive indices for desired combination and coupling minimizing transmission loss of the scintillation light pulse from the front crystal to the back crystal of the single crystal based scintillator;
    wherein the single crystal based scintillator comprises the Gd based garnet crystal of less than 1 mm as the front crystal is adapted to stop 100% of thermal neutrons and charged radiation particles and the alkali halide single crystal as the back crystal is provided to discriminate various kinds of the radiations in a mixed field of neutrons, gamma and the charged particles including alpha particle.

2. The phoswich detector as claimed in claim 1, wherein the Gd based garnet crystal includes single crystals of $Gd_3Ga_3Al_2O_{12}$ with $^{157}Gd$ and $^{155}Gd$ isotopes.

3. The phoswich detector as claimed in claim 2, wherein capture cross-section of the $^{157}Gd$ and $^{155}Gd$ isotopes and atomic density in the front Gd based garnet crystal stops up to 100% thermal neutrons in the front crystal which consequently emit conversion electrons, low energy X-rays and continuum of background gamma radiation whereby the background gamma radiation is detected in the back alkali halide single crystal.

4. The phoswich detector as claimed in claim 1, wherein the alkali halide single crystal includes single crystals of CsI.

5. The phoswich detector as claimed in claim 1, wherein both the front and the back crystals are configured to interact with incident gamma radiations which enables discrimination of the gamma radiations with different energies due to the dissimilar pulse-shapes generated through the interactions in one or both the crystals and measurement depth of interaction.

6. The phoswich detector as claimed in claim 5, wherein interaction of the gamma in both the front and the back crystals enables precise detection of line of response and position of origin of the radiation thus improving spatial resolution of emitting source.

7. The phoswich detector as claimed in claim 1, wherein both the front and the back crystals are doped with Ce, B in GGAG and Tl in CsI for highest PSD parameter.

8. A method for discriminating different kinds of radiations involving the phoswich detector as claimed in claim 1 comprising:
    involving a single crystal based scintillator having at least a pair of single crystals comprised of single crystals including a front crystal and a back crystal with identical refractive indices and different scintillation kinetics cooperating to generate a scintillation light pulse through interaction of the radiation elements with different scintillation kinetics;
    wherein the step of detecting the scintillation light pulse generated through interaction of radiation elements with different scintillation kinetics includes an opposite trend of dependence and difference in a decay time components of the combination of the two crystals;
    detecting the generated scintillation light pulse including the opposite trend of dependence and difference in the decay time components of the combination of the two single crystals in a photo-sensor coupled to said single crystal based scintillator involving dissimilarity in the scintillation light pulse shapes generated through said interactions;
    thereby significantly improving the discrimination and providing a superior "figure-of-merit" for the discrimination of the different kind of radiations;

wherein the thermal neutrons and charged radiation particles are stopped 100% in less than 1 mm of the front garnet crystal while high energy gamma passes through without much interaction and deposits an energy in a relatively larger back halide crystal.

\* \* \* \* \*